(12) United States Patent
Huang et al.

(10) Patent No.: US 11,225,987 B2
(45) Date of Patent: Jan. 18, 2022

(54) MOUNT BASE

(71) Applicant: SYNCMOLD ENTERPRISE CORP., New Taipei (TW)

(72) Inventors: Chun-Hao Huang, New Taipei (TW); Jen-Yi Lee, New Taipei (TW)

(73) Assignee: SYNCMOLD ENTERPRISE CORP., New Taipei (TW)

( * ) Notice: Subject to any disclaimer, the term of this patent is extended or adjusted under 35 U.S.C. 154(b) by 0 days.

(21) Appl. No.: 16/864,428

(22) Filed: May 1, 2020

(65) Prior Publication Data

US 2020/0347858 A1 Nov. 5, 2020

Related U.S. Application Data

(60) Provisional application No. 62/842,054, filed on May 2, 2019.

(30) Foreign Application Priority Data

Mar. 3, 2020 (TW) .................................. 109202347

(51) Int. Cl.
| | |
|---|---|
| *F16B 2/04* | (2006.01) |
| *F16B 9/02* | (2006.01) |
| *F16M 11/24* | (2006.01) |
| *F16M 13/02* | (2006.01) |
| *F16B 13/04* | (2006.01) |
| *A47B 13/00* | (2006.01) |
| *G06F 1/16* | (2006.01) |
| *H05K 5/02* | (2006.01) |
| *B25J 15/06* | (2006.01) |

(52) U.S. Cl.
CPC .............. *F16B 2/04* (2013.01); *B25J 15/0625* (2013.01); *F16B 9/02* (2013.01); *F16M 11/24* (2013.01); *F16M 13/02* (2013.01); *G06F 1/1601* (2013.01); *H05K 5/0234* (2013.01); *A47B 13/00* (2013.01); *F16B 13/04* (2013.01); *F16M 2200/08* (2013.01); *G06F 2200/1612* (2013.01)

(58) Field of Classification Search
CPC .... F16B 2/04; F16B 9/02; F16B 13/04; F16B 13/0808; F16M 11/04; F16M 2200/08; F16M 13/022; F16M 11/24; A47B 2097/005; A47B 13/00; A61B 17/70; G06F 1/1601; G06F 2200/1612; H05K 5/0234; B25J 15/0625
See application file for complete search history.

(56) References Cited

U.S. PATENT DOCUMENTS

| | | | | |
|---|---|---|---|---|
| 5,209,621 A | * | 5/1993 | Burbidge | ............ F16B 13/0808 411/340 |
| 5,417,531 A | * | 5/1995 | Brown | ...................... E05F 5/06 29/525.01 |
| 7,575,215 B1 | * | 8/2009 | Clark | ...................... A01K 97/10 248/222.11 |

(Continued)

*Primary Examiner* — Tan Le
(74) *Attorney, Agent, or Firm* — Muncy, Geissler, Olds & Lowe, P.C.

(57) ABSTRACT

A mount base is disclosed, wherein the mount base is detachably set in a hole on a plate for mounting a support arm supporting at least one display, the mount base comprises a guide rod, a first clamping unit, and a second clamping unit, wherein the plate is adjustably clamped by the first clamping unit and the second clamping unit.

14 Claims, 13 Drawing Sheets

(56) References Cited

U.S. PATENT DOCUMENTS

| | | | | |
|---|---|---|---|---|
| 8,469,323 B1* | 6/2013 | Deros | ............... | F16M 13/022 |
| | | | | 248/278.1 |
| 8,925,172 B2* | 1/2015 | English | ............... | F16B 13/0833 |
| | | | | 29/428 |
| 9,757,164 B2* | 9/2017 | Hess | ............... | A61B 17/7065 |
| 9,804,652 B2* | 10/2017 | Volek | ............... | G06F 1/1632 |
| D876,918 S * | 3/2020 | Good | ............... | D8/72 |
| 2007/0139870 A1* | 6/2007 | Lin | ............... | F16M 13/022 |
| | | | | 361/679.22 |
| 2018/0344025 A1* | 12/2018 | Corbo | ............... | F16M 13/022 |
| 2020/0191321 A1* | 6/2020 | Kleist | ............... | F16M 11/14 |

* cited by examiner

MOUNT BASE

CROSS REFERENCE TO RELATED APPLICATION

This application claims the benefit of U.S. Provisional Application Ser. No. 62/842,054 filed on May 2, 2019, and the benefit of Taiwan Patent Application Serial No. 109202347 filed on Mar. 3, 2020. The entirety of each Application is incorporated herein by reference.

BACKGROUND OF THE INVENTION

1. Field of the Invention

The present invention relates to a mount base. More particularly, the present invention relates to a mount base set on a desktop for mounting a support arm, which is supporting a display.

2. Description of Related Art

Conventionally, a supporting arm bearing a display is set on a desktop through a mount base which passes through a hole of the desktop, wherein a clamping plate of the mount base is adjusted by hand under the desktop to convert it into an expanded state, after that, a clamping unit of the mount base is then adjusted above the desktop so that the desktop is clamped between the clamping plate and the clamping unit. However, the conventional mount base must be adjusted under a plate to covert it between a retracted state and the expanded state, thus, the operation of the mount base is less convenient for the users. Besides, the display is usually connected to wires, those wires may be disorganized since the conventional mount base fails to include a routing space. Therefore, the fluency of using the display will be affected.

The present invention provides a mount base comprising a first knob, a knob rod, at least one wing plate, and a clamp block. The at least one wing plate may be converted between a retracted state and an expanded state by adjusting the first knob, which actuates the knob rod to rotate when the mount base is set in a hole of a plate. The distance between the clamp block and the at least one wing plate may be adjusted to clamp the plate when the at least one wing plate is at the expanded state. The mount base may be disassembled by a force when the at least one wing plate is at the retracted state.

SUMMARY OF THE INVENTION

The main object of the present invention is to provide a mount base, which is detachably set in a hole on a plate for mounting a support arm supporting at least one display. The mount base comprises: a guide rod detachably passing through the hole and including a hollow column extending along a first axis; a first clamping unit including a knob rod and at least one wing plate, the knob rod passes through the hollow column, the at least one wing plate is disposed on an end plate of the knob rod and is actuated together with the knob rod and converted between a retracted state and an expanded state; and a second clamping unit being set on the hollow column and moving back and forth along the first axis on the hollow column for being close to or away from the wing plate. When the mount base passes through the hole on the plate and is at a supportable state, the at least one wing plate remains at the expanded state and clamps the plate together with the second clamping unit; when the at least one wing plate is converted to the retracted state, the mount base is removable from the hole.

In one embodiment, the first clamping unit further includes a first knob being disposed on the guide rod and actuated together with the knob rod, the knob rod is actuated to rotate together with the first knob and the at least one wing plate is transferred between the retracted state and the expanded state by adjusting the first knob.

In one embodiment, the at least one wing plate has a free end, when the at least one wing plate is at the expanded state, an equivalent circle with the first axis as a center is defined by the free end of the at least one wing plate, wherein a first diameter of the equivalent circle is larger than a second diameter of the hole.

In one embodiment, the at least one wing plate further has a guide groove having a first end and a second end, the guide rod further has a positioning plate and at least one positioning column; wherein the positioning plate is formed on one end of the hollow column, the at least one positioning column passes through the guide groove and is disposed on the positioning plate, wherein the at least one wing plate is at the retracted state when the at least one positioning column is located at the first end of the guide groove, while the at least one wing plate is at the expanded state when the at least one positioning plate is located at the second end of the guide groove.

In one embodiment, when the at least one wing plate is transferred from the retracted state to the expanded state, the at least one positioning column moves from the first end to the second end of the guide groove.

In one embodiment, the at least one wing plate further has a pivot hole, the knob rod further has at least one pivoting column, wherein the at least one pivoting column passes through the pivot hole of the at least one wing plate and is fixed to the end plate, when a force rotates the first knob and the knob rod is actuated to rotate, the at least one wing plate is actuated to pivotally rotate with respect to the knob rod so that the at least one positioning column moves back and forth in the guide groove and converted between the retracted state and the expanded state.

In one embodiment, the mount base further comprises a central column extending along the first axis, passing through the knob rod and being fixed to the guide rod, when the first knob is rotated by the force, the knob rod is actuated to rotate while the central column fixed to the guide rod is unactuated.

In one embodiment, the central column includes a cylinder and a base plate, the knob rod has a hollow main body, wherein the cylinder extends along the first axis and has a first segment and a second segment, the support arm is set on the first segment, the second segment passes through the hollow main body of the knob rod, the base plate is disposed on an end part of the second segment and is located at a side of the at least one wing plate away from the positioning plate so that the at least one positioning column is set thereon; the knob rod and the at least one wing plate are actuated together with the first knob while the central column and the guide rod are unactuated when the first knob rotates with respect to the first axis.

In one embodiment, the second clamping unit further comprises a second knob and a clamp block, the second knob has an internal threaded surface, the hollow column of the guide rod has an external threaded surface, wherein the second clamping unit is screwed to the external threaded surface via the second knob, the clamp block is disposed on the second knob, wherein the clamp block and the second knob are actuated simultaneously to move back and forth on the cylinder along the first axis by adjusting the second knob.

In one embodiment, the clamp block has a notch, when the at least one wing plate is at the expanded state, an orthographic projection of the notch and an orthographic projection of the at least one wing plate do not overlap on the plate.

In one embodiment, the second knob rotates with respect to the guide rod about the first axis, the second knob rotates with respect to the clamp block.

In one embodiment, the mount base further comprises a positioning block, wherein the positioning block includes a locking part and a sliding part, the guide rod further includes a positioning slot forming on the external threaded surface, wherein the positioning block is fixed to the clamp block via the locking part, and the sliding part slides in the positioning slot so that the orthographic projection of the notch projected on the plate stays without displacement when the clamp block moves back and forth with respect to the guide rod along the first axis.

In one embodiment, when the mount base passes through the hole of the plate and the at least one wing plate is at the expanded state, the second knob is rotated by the force and the clamp block is actuated to move toward the at least one wing plate so that the plate is clamped by at least one wing plate and the clamp block on both sides of the plate, meanwhile, the mount base is at the supportable state.

In one embodiment, the clamp block further has a ring body, a ring shell, and a gasket, wherein the ring shell is disposed on one side of the ring body, the gasket is disposed on another side of the ring body, the ring body has a first fracture, the ring shell has a second fracture, and the gasket has a third fracture, wherein the first fracture, the second fracture, and the third fracture are overlapped and combined into the notch.

In one embodiment, the second knob has a nut and a C-ring, the nut has an abutting part and a trench, wherein the abutting part abuts against the ring body of the clamp block, the C-ring is disposed in the trench so that the ring body is rotatably clamped between the abutting part and the C-ring.

DETAILED DESCRIPTION OF THE PREFERRED EMBODIMENT

Hereafter, examples will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Figure 1:
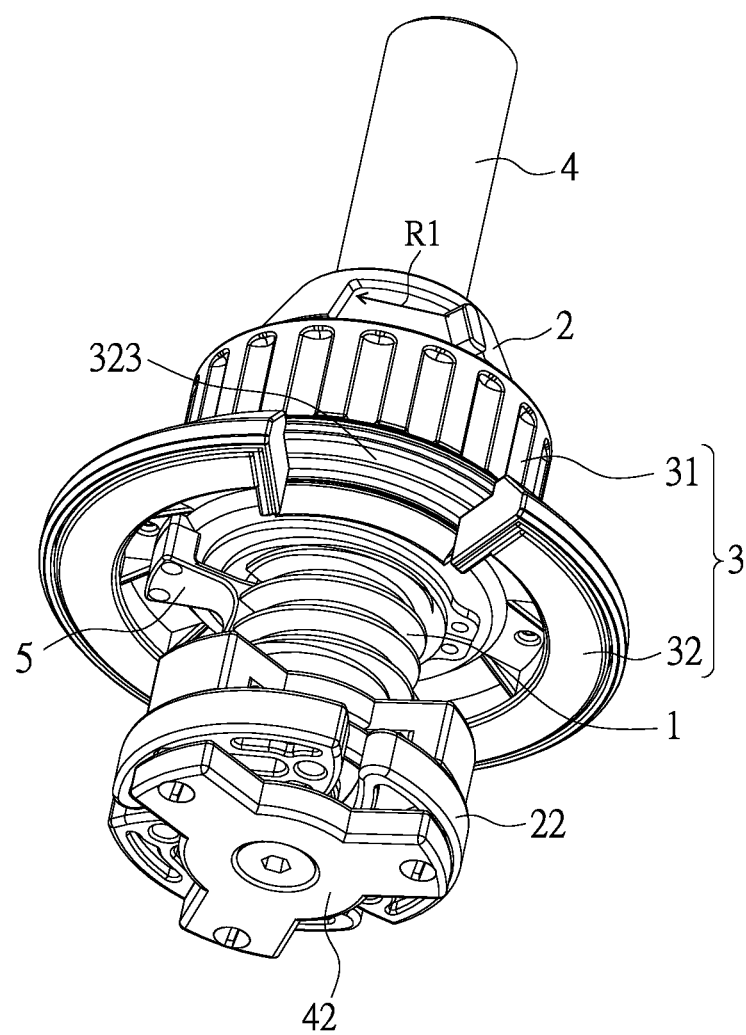
FIG. 1 is a perspective view showing a mount base of the first embodiment of the present invention
Figure 2:
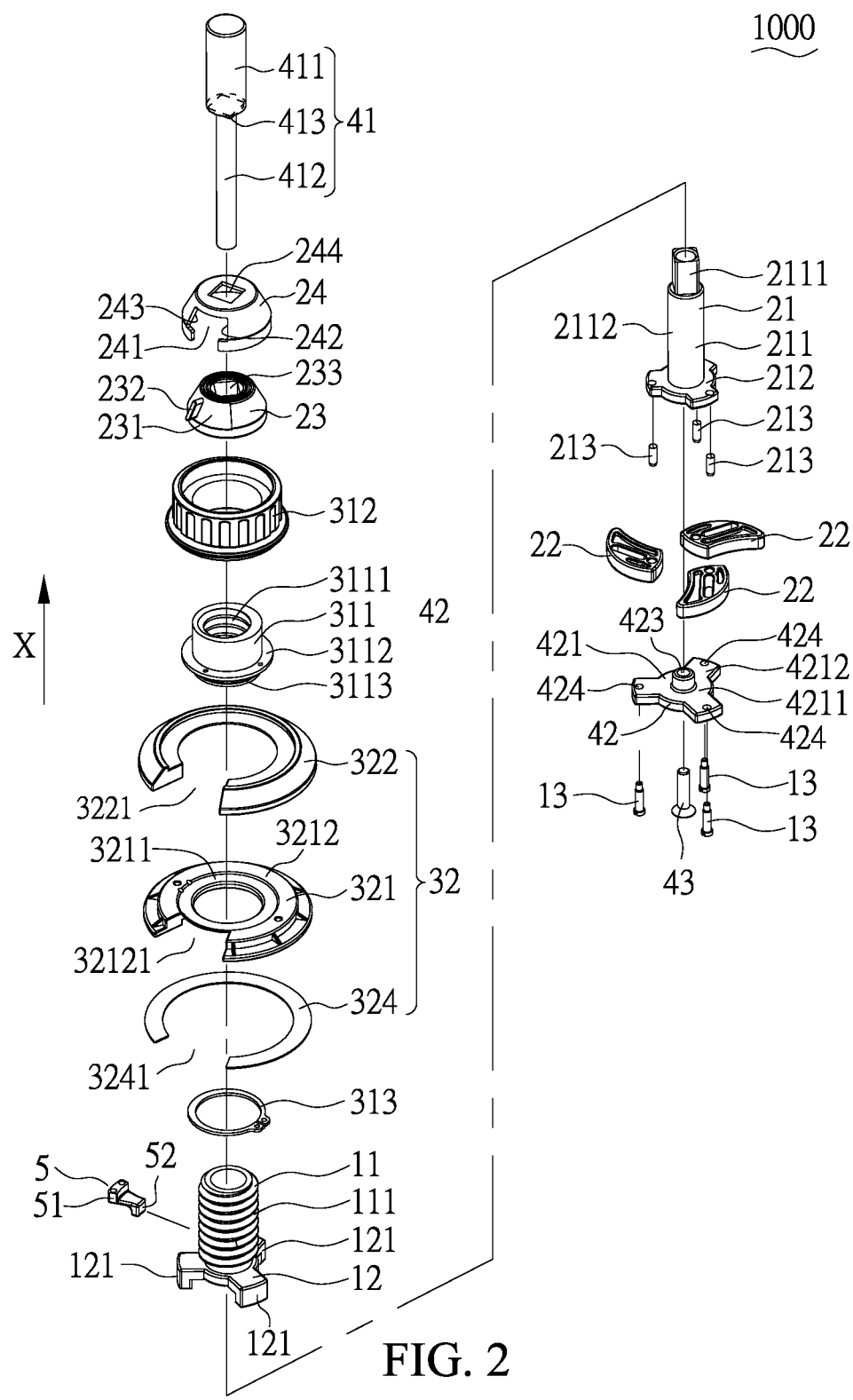
FIG. 2 is an explosive view showing mount base of the first embodiment of the present invention.

FIG. 1 shows a perspective view and FIG. 2 shows an explosive view of the mount base 1000 of the first embodiment of the present invention. Wherein the mount base 1000 is detachably set in a hole 2001 of a plate 2000 (please refer to FIG. 8) and is selectively clamping the plate 2000 for mounting a supporting arm 4000 which is supporting a display 5000 (refer to FIG. 11). In the present embodiment, the plate 2000 is a desktop. The mount base 1000 mainly comprises a guide rod 1, a first clamping unit 2, a second clamping unit 3, a central column 4, and a positioning block 5.

Figure 3:
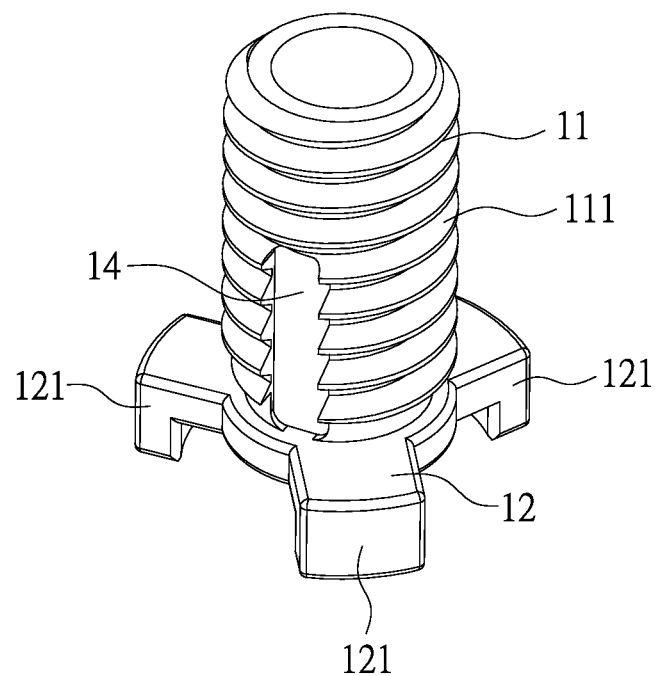
FIG. 3 is a perspective view showing the guide rod mount base of the first embodiment of the present invention.

Please refer to FIG. 2 and FIG. 3, wherein the guide rod 1 extends along a first axis X and includes a hollow column 11, a positioning plate 12, three positioning columns 13, and a positioning slot 14. The hollow column 11 has an external threaded surface 111, and the positioning plate 12 is formed at one end of the hollow column 11 and having three convex parts 121. The positioning columns 13 are disposed separately on each of the convex parts 121, and the positioning slot 14 is formed on the external threaded surface 111.

The first clamping unit 2 includes a knob rod 21, three wing plates 22, a first knob 23, and a limiting cover 24.

The knob rod 21 passes through the hollow column 11 and rotates with respect to the hollow column 11. Also, the knob rod 21 has a hollow main body 211, an end plate 212, and three pivoting columns 213. The hollow main body 211 has a first section 2111 and a second section 2112 that are connected with each other, wherein the shape of the cross-section of the outer sidewall of the first section 2111 along a second axis Y, which is vertical to the first axis X, is a square, and the shape of the cross-section of the outer sidewall of the second section 2112 along the second axis Y is a circle.

Figure 4:
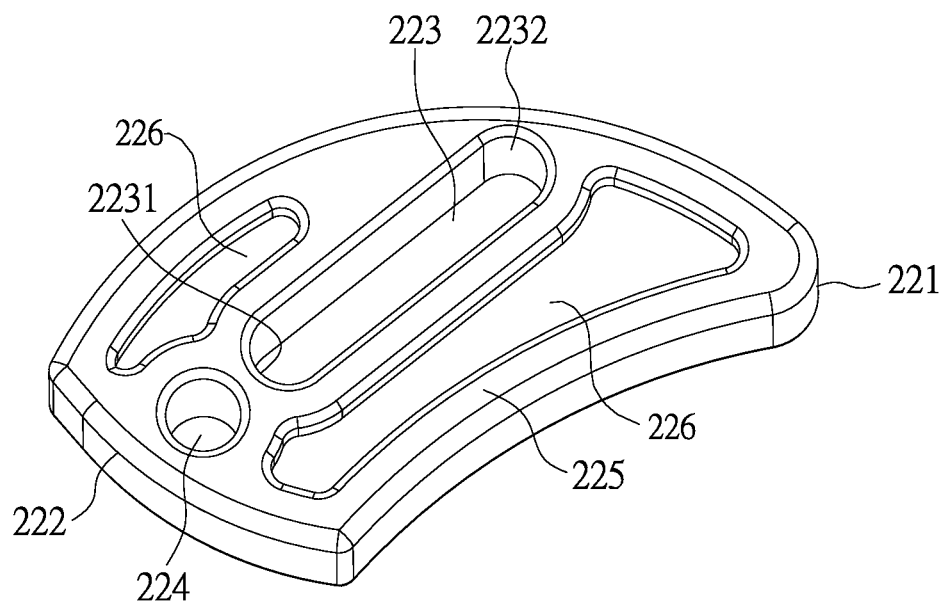
FIG. 4 is a perspective view showing the wing plates of the first embodiment of the present invention.

Please refer to the perspective view of one wing plate 22 illustrated in FIG. 4, wherein each of the wing plates 22 has a free end 221, a pivoting end 222, a guide groove 223, a pivoting hole 224, a main plate 225, and two decorated holes 223. In each of the wing plates 22, the free end 221 and the pivoting end 222 are located at two ends of the main plate 225, and the guide groove 223 is an elongated through hole formed on the main plate 225 and has a first end 2231 and a second end 2232. The first end 2231 is adjacent to the pivoting end 222, and the second end 2232 is adjacent to the free end 221. The positioning columns 13 of the guide rod 1 respectively pass through the guide grooves 223 and are able to relatively slide between the first end 2231 and the second end 2232. The pivoting hole 224 is formed on the main plate 225 and adjacent to the pivoting end 222. Each of the pivoting columns 213 of the knob rob 21 correspondingly pass through the pivoting hole 224 and is fixed to the end plate 212 of the knob rod 21. The wing plates 22 are connected to the end plate 212 of the knob rod 21 via the pivoting columns 213, and each of the pivoting columns 213 is rotatably passing through one of the pivoting holes 224; therefore, when the knob rod 21 rotates, the pivoting columns 213 rotates about the first axis X, and the wing plates 22 respectively rotate about the pivoting columns 213. Also, the decorated holes 226 are formed for reducing the weight of the wing plates 22, the shape and size thereof are not particularly limited.

The first knob 23 has a hollow tube 231, a convex block 232, and an assembling hole 233. The hollow tube 231 is sleeved on the knob rod 21, the convex block 232 is formed on an outer surface of the hollow tube 231 for receiving the force applied by the user, and the assembling hole 233 is a square-shaped through hole, which conforms to the outer sidewall of the first section 2111 of the knob rod 21. Therefore, the knob rod 21 is actuated to rotate when the hollow tube 231 rotates.

The limiting cover 24 covers the hollow tube 231 and has a via hole 241, a first blocking part 242, a second blocking part 243, and an engaging hole 244. The via hole 241 is formed between the first blocking part 242 and the second blocking part 243, and the engaging hole 244 is a square-shaped through hole engaging with the central column 4. When the hollow tube 231 rotates, the limiting cover 24 remains still and is unactuated with the hollow tube 231. The convex block 232 extends out from the via hole 241, and the force can be applied to rotate the convex block 232 between the first blocking part 242 and the second blocking part 243 and make it selectively abut against the first blocking part 242 or the second blocking part 243. Accordingly, the knob rod 21 simultaneously rotates together with the first knob 23 about the first axis X.

Figure 5:
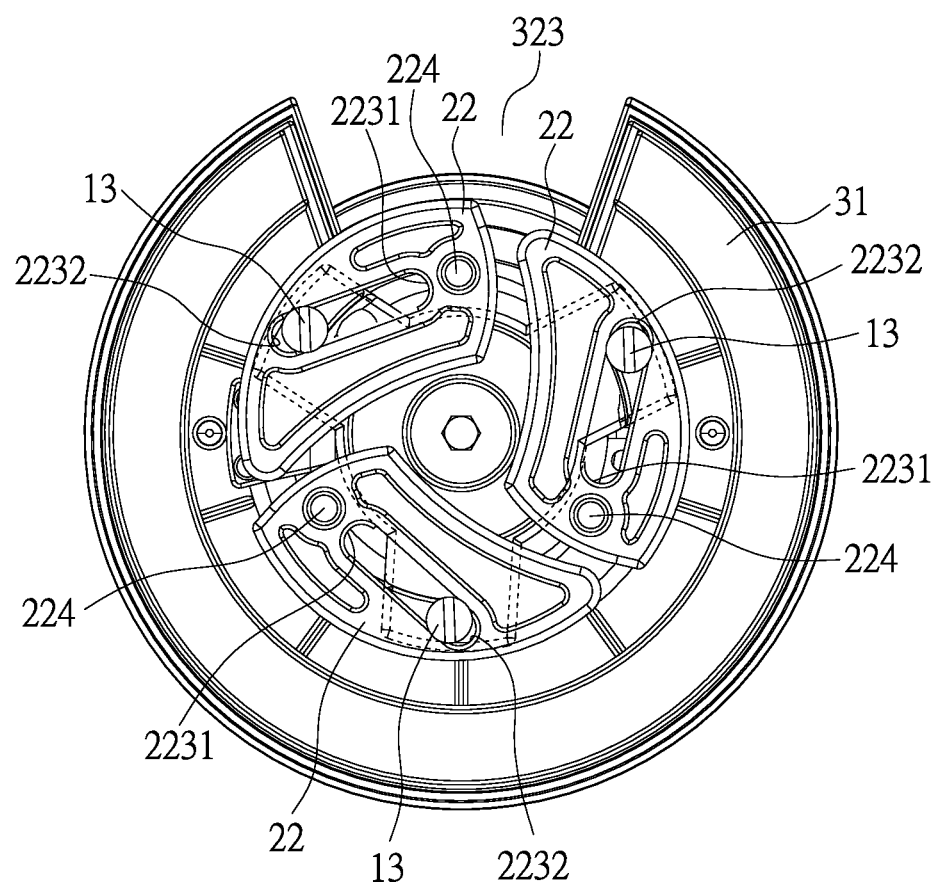
FIG. 5 is a bottom view showing the wing plates at the retracted state of the first embodiment of the present invention.
Figure 6:
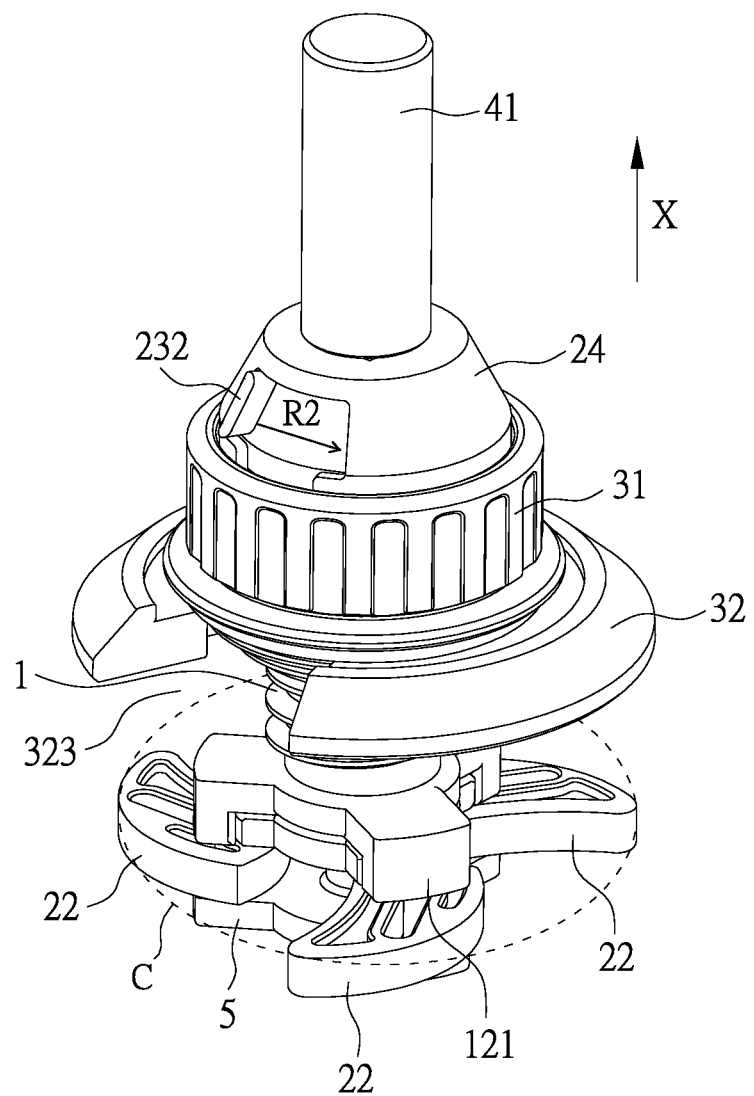
FIG. 6 is a perspective view of the wing plates at the retracted state of the first embodiment of the present invention.
Figure 7:
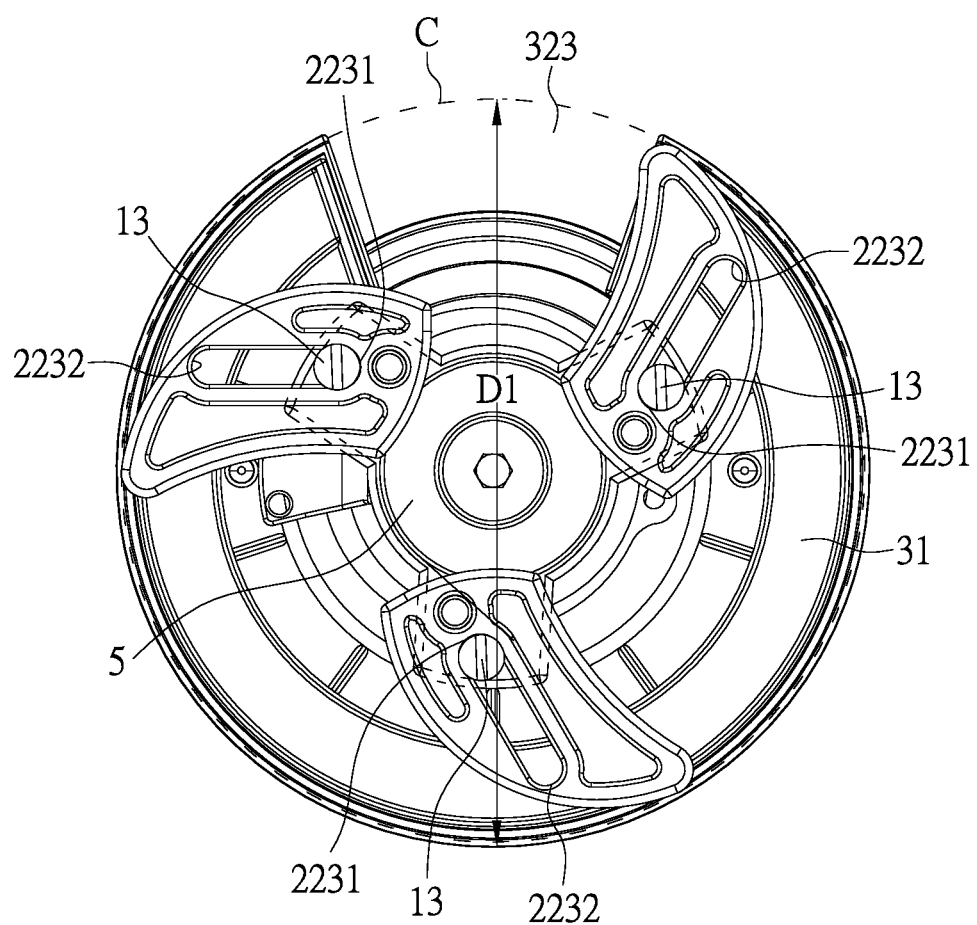
FIG. 7 is a bottom view of the wing plates at the expanded state of the first embodiment of the present invention.

Please refer to FIG. 1 and FIG. 5, when the convex block 232 of the first knob 23 abuts against the first blocking part 242, the wing plates 22 are at a retracted state. Among the retracted state, the positioning columns 13 are located respectively at the second end 2232 of each of the guide grooves 223. When the force is applied to the convex block 232 to rotate the first knob 23 about the first axis X in a first rotating direction R1 until the convex block 232 abuts against the second blocking part 242, the knob rod 21 and the wing plates 22 are actuated by the first knob 23 wherein the knob rod 21 rotates about the first axis X in the first rotating direction R1, and the pivoting ends 222 of the wing plates 22 rotate with the pivoting columns 213 around the first axis X in the first rotating direction R1. The positioning columns 13 stay still when the wing plates 22 rotate around the first axis X so that the location of the positioning columns 13 changes with respect to the guide grooves 223 of the wing plates 22. That is, the wing plates 22 are expanded in a radial direction while the positioning columns 13 slide from the second ends 2232 to the first ends 2231 of the guide grooves 22. As illustrated in FIG. 6 and FIG. 7, the wing plates 22 are at an expanded state, wherein the free ends 221 of the wing plates 22 define an equivalent circle C having a first diameter D1 with the first axis X as a center. When a force is applied to rotate the convex block 232 about the first axis X in a second direction R2 for moving the convex block 232 from the second blocking part 243 to the first blocking part 242, the knob rod 21 is actuated together with the first knob 23 to rotate about the first axis X in the second rotating direction R2, and the wing plates 22 are actuated with the first knob 23 so that the pivoting ends 222 rotate about the first axis X in the second rotating direction R2. Accordingly, the positioning columns 13 are actuated to change positions with respect to the wing plates 22, sliding from the first end 2231 to the second end 2232 of the guide grooves 223, and making the wing plates 22 retract in the radial direction.

Please refer to FIG. 1 and FIG. 2, wherein the second clamping unit 3 includes a second knob 31 and a clamp block 32. The clamp block 32 is set on the second knob 31 and having a ring body 321, a ring shell 322, a notch 323, and a gasket 324. The ring shell 322 covers the ring body 321 from one side of the ring body 321 near the second knob 31, while the gasket 324 is disposed on one side of the second knob 31 opposite to the ring shell 322. The ring body 321 has an inner disk 3211 and an outer disk 3212, wherein the outer disk 3212 extends from the edge of the inner disk 3211 and has a first fracture 32121, the ring shell 322 covers the outer disk 3212 of the ring body 321 and has a second fracture 3221, and the gasket 324 has a third fracture 3241. The first fracture 32121, the second fracture 3221, and the third fracture 3241 are overlapped and combined into the notch 323 (as illustrated in FIG. 1).

The second knob 31 is rotatably disposed on the external threaded surface 111 of the hollow column 11 of the guide rod 1, and includes a nut 311, an outer shell 312, and a C-ring 313. Specifically, the outer shell 312 is fixed to the nut 311 and has an uneven surface for users to apply a force thereon. The ring shell 322 is clamped between the ring body 321 and the outer shell 312. The nut 311 has an internal threaded surface 3111, an abutting part 3112, and a trench 3113. The second knob 31 is screwed to the external threaded surface 111 of the guide rod 1 through the internal threaded surface 3111 of the nut 311. The abutting part 3112 abuts against the inner disk 3211 of the ring body 321. The C-ring 313 is disposed in the trench 3113, and the outer diameter of the C-ring is slightly larger than the inner diameter of the inner disk 3211; therefore, the ring body 321 is clamped between the abutting part 3112 and the C-ring 313. Besides, the ring body 321 does not rotate simultaneously with the second knob 31 because the ring body 321 is not tightly clamped by the abutting part 3112 and the C-ring 313, however, the clamp block 32 can be actuated by the second knob 31 to move back and forth on the external threaded surface 111 along the first axis X.

The central column 4 extends along the first axis X, passes through the knob rod 21, and is fixed to the guide rod 1; therefore, when the first knob 23 is rotated by the force, the knob rod 21 is actuated to rotate while the central column 4 is fixed to the guide rod 1 and remains still. The central column 4 includes a cylinder 41, a base plate 42, and a locking post 43. The cylinder 41 passes through the knob rod 21, the positioning columns 13 pass through the base plate 42 and are fixed to the positioning plate 12. The cylinder 41 and the base plate 42 are connected to each other via the locking post 43.

Specifically, the cylinder 41 has a first segment 411, a second segment 412, and an engaging block 413. A diameter of the first segment 411 is larger than a diameter of the second segment 412. A transfer sleeve 4001 of the supporting arm 4000 is mounted on the first segment 411. The second segment 412 passes through the hollow main body 211 of the knob rod 21 and does not actuated with the knob rod 21. The engaging block 413 having a square shape is disposed between the first segment 411 and the second segment 412 and engaged to the engaging hole 244 of the limiting cover 24. The base plate 42 has a main body 421, a locking hole 423, and three through holes 424. The main body 421 has a middle part 4211 and three protrusions 4212. The locking hole 423 is formed on the middle part 4211, and the locking post 43 passes through the locking hole 423 and is locked to the cylinder 41. The protrusions 4212 extend from the middle part 4211, the through holes 424 are formed respectively on the protrusions 4212, and the positioning columns 13 correspondingly pass through the through holes 424 and the guide grooves 223 and are fixed to the convex parts 121. Accordingly, when the first knob 23 rotates and the knob rod 21 is actuated to rotate, the central column 4 and the limiting cover 24 remain still. The wing plates 22 are accommodated between the base plate 42 and the positioning plate 12 of the guide rod 1.

The positioning block 5 has a locking part 51 and a sliding part 52, and is locked to one side of the ring body 321 of the clamp block 32 opposite to the ring shell 322. The sliding part 52 is slidably disposed in the positioning slot 14 and slides along the positioning slot 14. In this way, when the clamp block 32 moves back and forth along the first axis X due to the rotation of the second knob 31, the clamp block 32 can move without rotation. Accordingly, the relative location between the notch 323 and the guide rod 1 is constant without displacement.

Figure 8:
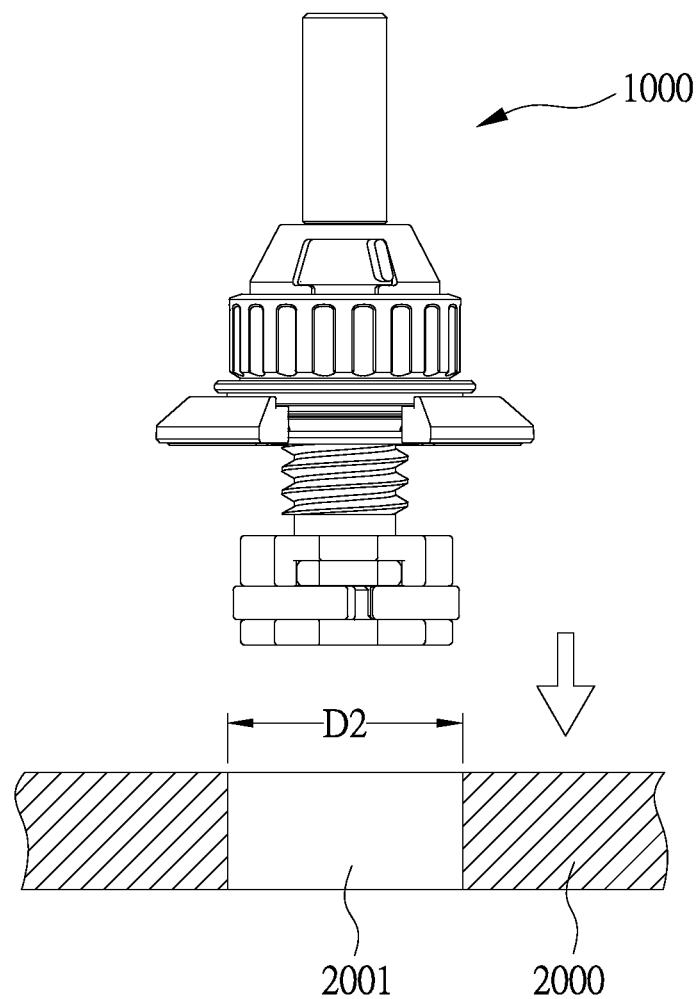
FIG. 8 is an operational schematic view of the mount base of the first embodiment of the present invention.
Figure 9:
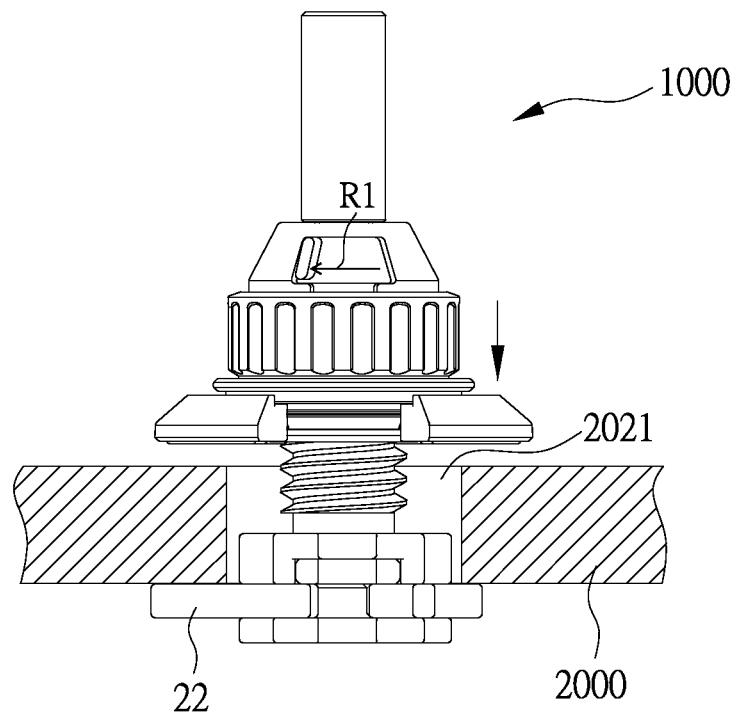
FIG. 9 is an operational schematic view of the mount base of the first embodiment of the present invention.
Figure 10:
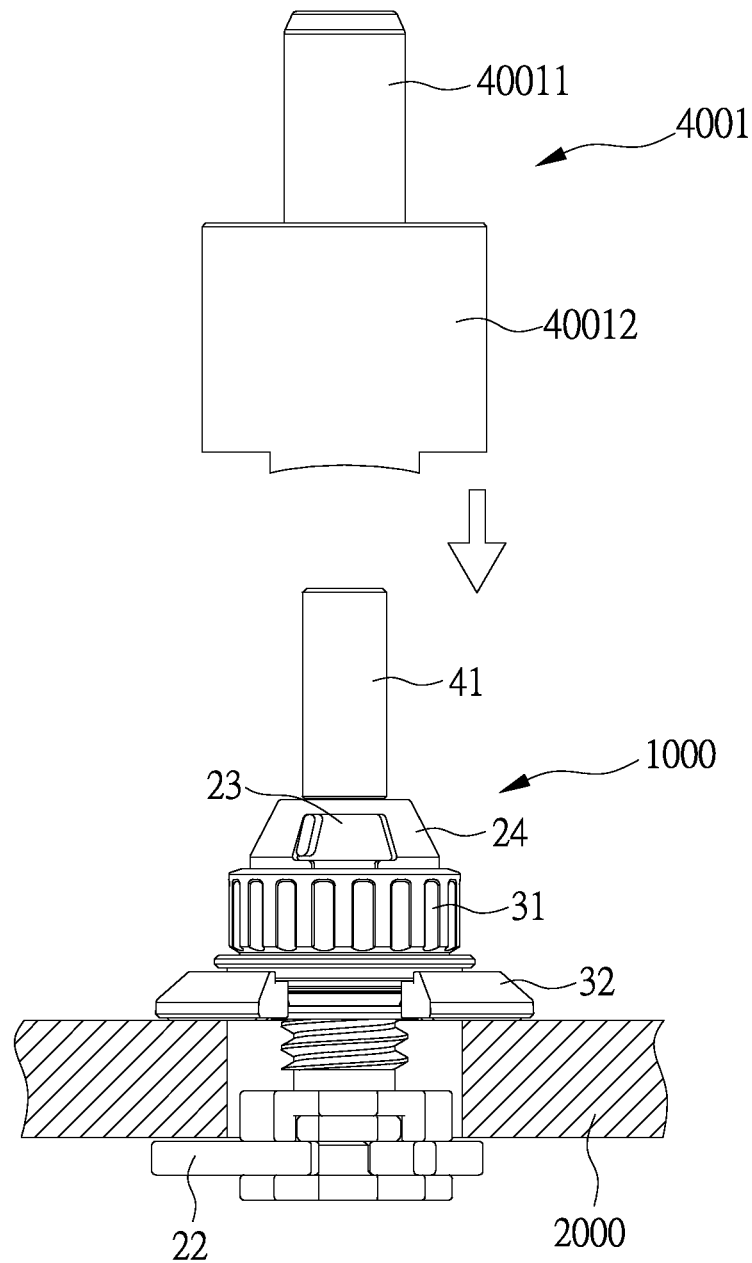
FIG. 10 is an operational schematic view of the mount base of the first embodiment of the present invention.
Figure 11:
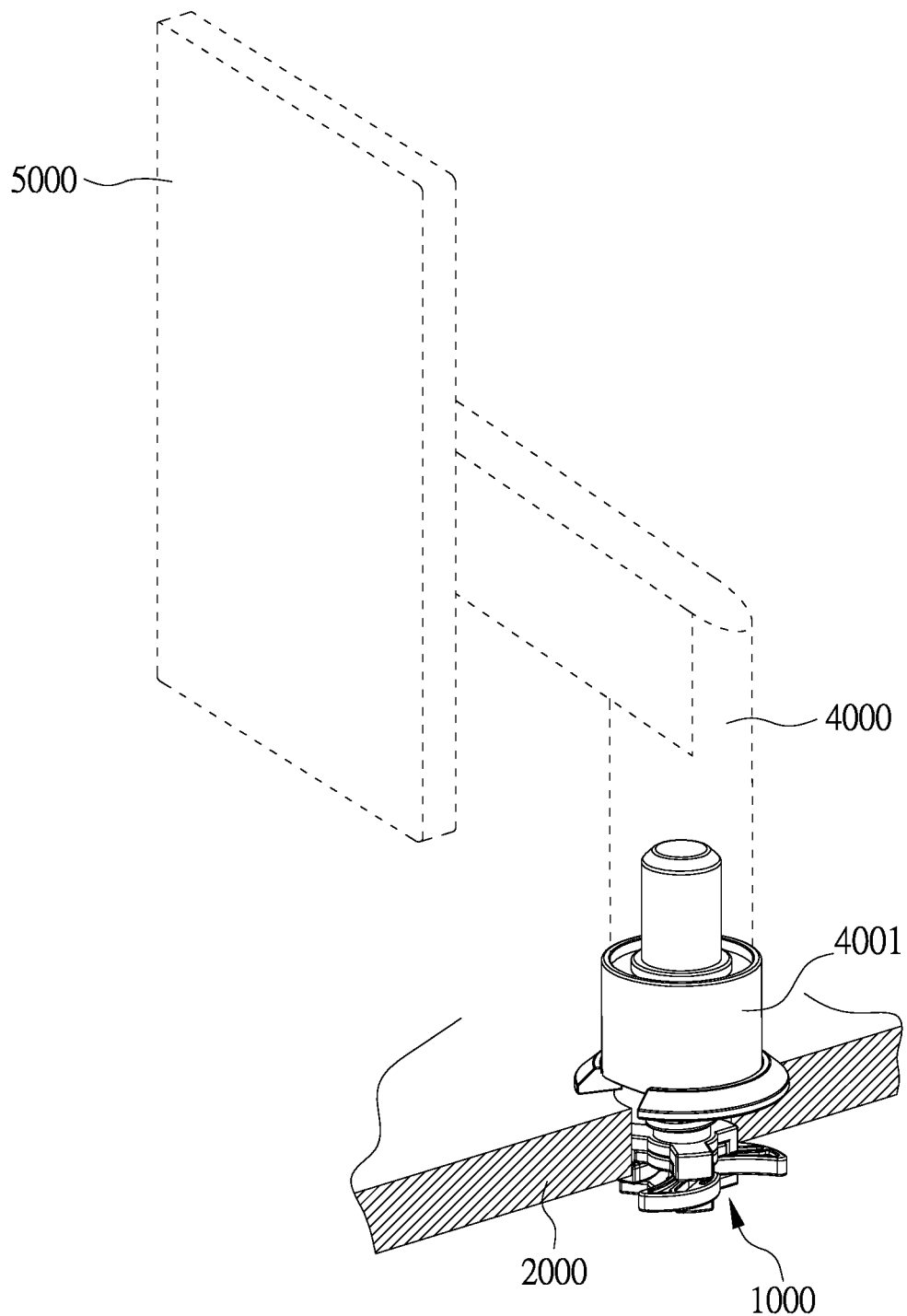
FIG. 11 is an operational schematic view of the mount base of the first embodiment of the present invention.

The operation process of the mount base 1000 will be described below with illustrations of FIG. 8 to FIG. 11. First of all, under the normal condition as illustrated in FIG. 8, the wing plates 22 are at the retracted state, wherein the convex block 232 of the first knob 23 abuts against the first blocking part 242. The mount base 1000 passes through the hole 2001 of the plate 2000 with the wing plates 22 facing toward the plate 2000 because a second diameter D2 of the hole 2001 is smaller than the outer diameter of the clamp block 32 of the second clamping unit 3. Then, as illustrated in FIG. 9, a force is applied to the convex block 232 for rotating the first knob 23 in the first rotating direction R1 until the convex block 232 abuts against the second blocking part 243 and the wing plates 22 convert from the retracted state into the expanded state. Meanwhile, the first diameter D1 of the equivalent circle C defined by the free ends 221 of the wing plates 22 with the first axis X as the center is larger than the second diameter D2 of the hole 2001; therefore, the wing plates 22 can stay at one side of the plate 2000, and the mount base 1000 cannot be pulled out from the hole 2001 of the plate 2000. After that, a force is applied to the outer shell 312 of the second knob 31 to rotate the second knob 31 in the first rotating direction R1. The second knob 31 push the clamp block 32 and move toward the plate 2000 along the first axis X. As illustrated in FIG. 10, the second knob 31 is moved until the wing plates 22 of the first clamping unit 2 and the gasket 324 of the clamp block 32 of the second clamping unit 3 respectively clamp on both sides of the plate 2000. Accordingly, the mount base 1000 firmly clamps the plate 2000, and the mount base 1000 is at a supportable state in the meantime. Further. Please refer to FIG. 10, when the mount base 1000 is at the supportable state, a transfer sleeve 4001 can be set on the mount base 1000, wherein the transfer sleeve 4001 has a first barrel 40011 and a second barrel 40012, the first barrel 40011 is set on and covers the first segment 411 of the cylinder 41 of the central column 4, the second barrel 40012 is set on and covers the first knob 23, the limiting cover 24 and the second knob 31. As illustrated in FIG. 11, the installation of the display 5000 is completed after a main arm part 4002 of the supporting arm 4000 bearing the display 5000 is set on the first barrel 40011 of the transfer sleeve 4001. Besides, an orthographic projection of the notch 323 and an orthographic projection of the at least one wing plate 22 do not overlap on the plate. That is, the notch 323 interconnects the hole 2001 and forms a passageway that passes through the plate 2000 when the mount base 1000 is set on the plate 2000, and the passageway for the wires will not be blocked by the wing plates 22 at the expanded state.

When removing the mount base 1000 from the plate 2000, a force is applied to rotate the second knob 31 in the second rotating direction R2 so that the clamp block 32 and the first knob 31 moves away from the plate 2000. A force is then applied on the convex block 232 to move the convex block 232 from the second blocking part 243 to the first blocking part 242; therefore, the wing plates 22 are actuated to convert from the expanded state to the retracted state. In the meantime, the mount base 1000 can be pulled out from the hole 2001 of the plate 2000 to finish the disassembly.

According to the aforementioned embodiment, the mount base is capable of passing through a hole (hub hole) of a desktop and being fixed to the desktop but the hub hole can still collect the wires. Also, the transfer sleeve set on the mount base can be mounted directly by the supporting arm for bearing the display.

Figure 12:
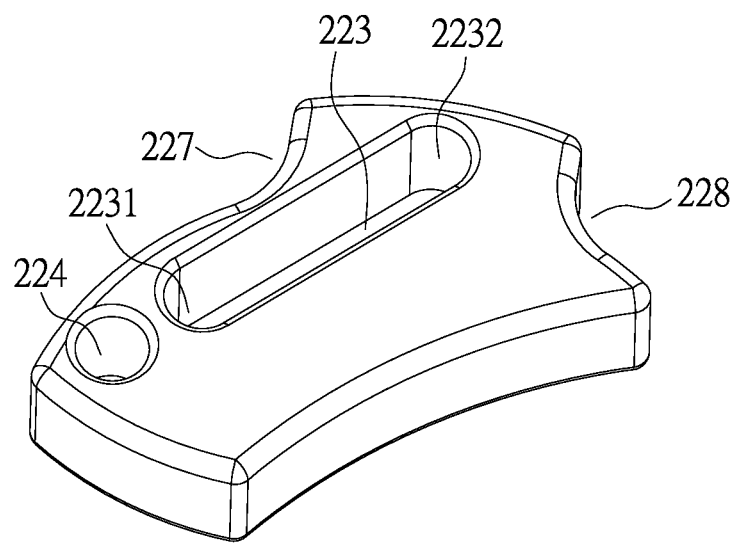
FIG. 12 is a perspective view of the wing plate of the second embodiment of the present invention.
Figure 13:
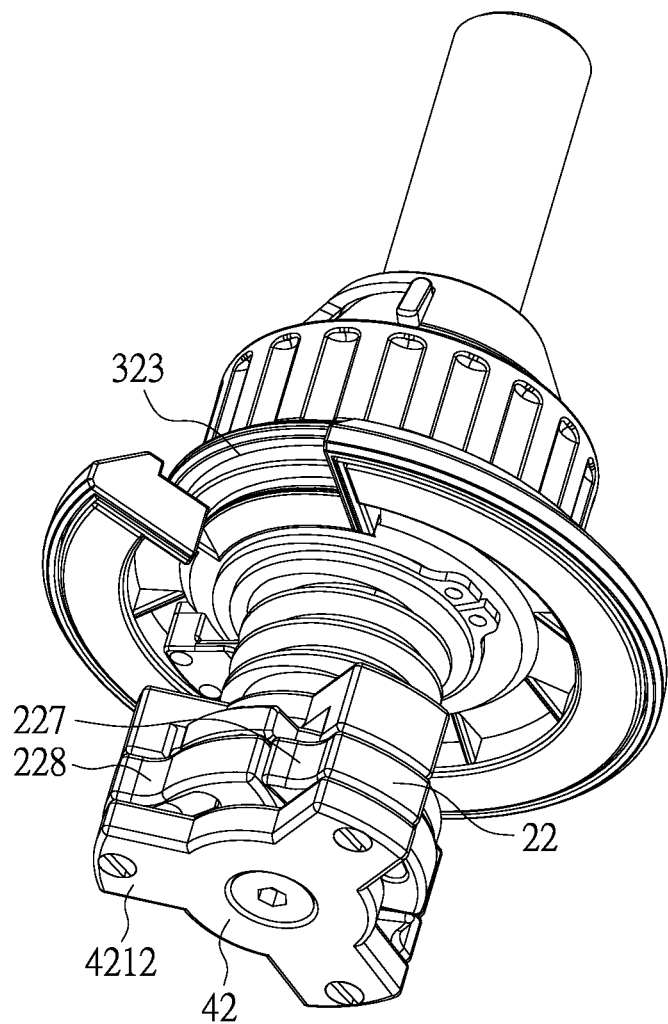
FIG. 13 is a perspective view of the mount base of the second embodiment of the present invention.

Please refer to FIG. 12 showing the wing plate 22 of the mount base 1000 and refer to FIG. 13 showing the mount base 1000 of the second embodiment. The mount base 1000 of the second embodiment is almost the same as the mount base 1000 of the first embodiment. The difference between them is the shape of the wing plates 22. In the present embodiment, each of the wing plates 22 has a first recess 227 and a second recess 228. When the wing plates 22 are at the retracted state, the first recesses 227 and the second recesses 228 are aligned with the depressions between three protrusions 4212 of the base plate 42 and the depressions between three convex parts 121 of the positioning plate 12. One of the first recesses 227 is aligned with the notch 323 for the wires to pass through.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A mount base, being detachably set in a hole of a plate, comprising:
    a guide rod detachably passing through the hole and including a hollow column, a positioning plate, and at least one positioning column, the hollow column extending along a first axis, the positioning plate being formed on one end of the hollow column, and the at least one positioning column passing through the guide groove and being disposed on the positioning plate;
    a first clamping unit including a knob rod and at least one wing plate, the at least one wing plate comprising a guide groove having a first end and a second end, wherein the knob rod passes through the hollow column, and the at least one wing plate is disposed on an end plate of the knob rod, wherein the at least one wing plate is at a retracted state when the at least one positioning column is located at the first end of the guide groove, and the at least one wing plate is at an expanded state when the at least one positioning plate is located at the second end of the guide groove; and a second clamping unit being set on the hollow column and moving back and forth on the hollow column along the first axis for being close to or away from the at least one wing plate;

wherein when the mount base passes through the hole of the plate and is at a supportable state, the at least one wing plate is at an expanded state, and the plate is clamped by the at least one wing plate and the second clamping unit.

2. The mount base as claimed in claim 1, the first clamping unit further comprising a first knob being disposed on the guide rod and actuated together with the knob rod, wherein the knob rod is actuated to rotate together with the first knob and the at least one wing plate is transferred between a retracted state and the expanded state by adjusting the first knob.

3. The mount base as claimed in claim 2, the at least one wing plate comprising a free end, wherein when the at least one wing plate is at the expanded state, an equivalent circle with the first axis as a center is defined by the free end of the at least one wing plate, and wherein a first diameter of the equivalent circle is larger than a second diameter of the hole.

4. The mount base as claimed in claim 1, wherein when the at least one wing plate is transferred from the retracted state to the expanded state, the at least one positioning column moves from the first end to the second end of the guide groove.

5. The mount base as claimed in claim 4, the at least one wing plate further comprising a pivot hole, and the knob rod further comprising at least one pivoting column, wherein the at least one pivoting column passes through the pivot hole of the at least one wing plate and is fixed to the end plate, and when a force rotates the first knob and the knob rod is actuated to rotate, the at least one wing plate is actuated to pivotally rotate with respect to the knob rod so that the at least one positioning column moves back and forth in the guide groove and the at least one wing plate converts between the retracted state and the expanded state.

6. The mount base as claimed in claim 5, further comprising a central column extending along the first axis, passing through the knob rod, and being fixed to the guide rod, wherein the knob rod is actuated to rotate while the central column fixed to the guide rod is unactuated when the first knob is rotated by the force.

7. The mount base as claimed in claim 6, the central column comprising a cylinder and a base plate, and the knob rod comprising a hollow main body, wherein the cylinder extends along the first axis and has a first segment and a second segment, the support arm is set on the first segment, and the second segment passes through the hollow main body of the knob rod, and the base plate is disposed on an end part of the second segment and is located at a side of the at least one wing plate away from the positioning plate so that the at least one positioning column is set thereon, and wherein the knob rod and the at least one wing plate are actuated together with the first knob while the central column and the guide rod are unactuated when the first knob rotates with respect to the first axis.

8. The mount base as claimed in claim 1, the second clamping unit further comprising a second knob and a clamp block, wherein the second knob comprises an internal threaded surface, the hollow column of the guide rod comprises an external threaded surface, and wherein the second clamping unit is screwed to the external threaded surface via the second knob, and the clamp block is disposed on the second knob, and wherein the clamp block and the second knob are actuated simultaneously to move back and forth on the cylinder along the first axis by adjusting the second knob.

9. The mount base as claimed in claim 8, the clamp block comprising a notch, and wherein when the at least one wing plate is at the expanded state, an orthographic projection of the notch and an orthographic projection of the at least one wing plate do not overlap on the plate.

10. The mount base as claimed in claim 9, wherein when the second knob rotates with respect to the guide rod about the first axis, the second knob rotates with respect to the clamp block.

11. The mount base as claimed in claim 10, further comprising a positioning block, the positioning block comprising a locking part and a sliding part, the guide rod further comprising a positioning slot forming on the external threaded surface, wherein the positioning block is fixed to the clamp block via the locking part, and the sliding part slides in the positioning slot so that the orthographic projection of the notch projected on the plate stays without displacement when the clamp block moves back and forth with respect to the guide rod along the first axis.

12. The mount base as claimed in claim 11, wherein when the mount base passes through the hole of the plate and the at least one wing plate is at the expanded state, the second knob is rotated by the force and the clamp block is actuated to move toward the at least one wing plate so that the plate is clamped by at least one wing plate and the clamp block on both sides of the plate, and the mount base is at the supportable state.

13. The mount base as claimed in claim 12, the clamp block further comprising a ring body, a ring shell, and a gasket, wherein the ring shell is disposed on one side of the ring body, the gasket is disposed on the other side of the ring body, and the ring body comprises a first fracture, the ring shell comprises a second fracture, and the gasket comprises a third fracture, wherein the first fracture, the second fracture, and the third fracture are overlapped and combined into the notch.

14. The mount base as claimed in claim 13, the second knob comprising a nut and a C-ring, and the nut comprising an abutting part and a trench, wherein the abutting part abuts against the ring body of the clamp block, and the C-ring is disposed in the trench so that the ring body is rotatably clamped between the abutting part and the C-ring.

* * * * *